United States Patent
Takemura

[11] Patent Number: 5,919,306
[45] Date of Patent: Jul. 6, 1999

[54] SILICON MELTING CRUCIBLE

[75] Inventor: Kaoru Takemura, Amagasaki, Japan

[73] Assignee: Sumitomo Sitix Corporation, Amagasaki, Japan

[21] Appl. No.: 08/963,064

[22] Filed: Nov. 3, 1997

[51] Int. Cl.$^6$ ................................................ C30B 35/00
[52] U.S. Cl. .................... 117/200; 117/213; 117/900; 65/DIG. 8
[58] Field of Search ............................... 117/18, 31, 200, 117/213, 900; 65/374.15, DIG. 8

[56] References Cited

FOREIGN PATENT DOCUMENTS 63-315263  12/1988  Japan .
3-290393   12/1991  Japan .
6-32692     2/1994  Japan .

Primary Examiner—Felisa Hiteshew
Attorney, Agent, or Firm—Armstrong, Westerman, Hattori, McLeland & Naughton

[57] ABSTRACT

A silicon melting crucible having a double structure, in which a quartz crucible is inserted inside of a carbon crucible, is provided with devices for preventing deformation, such as turning-down, buckling and bending at an upper portion of the quartz crucible, or invasion of an SiO gas into a space between the quartz crucible and the carbon crucible during pulling up of a silicon single crystal. According to one form of the invention an upper portion of the quartz crucible has a frusto-conical inclined portion with an angle of inclination desirably of from 5° to 40°. According to another form of the invention a carbon ring having a cross section of either L-shape or U-shape is applied to the upper portion of the quartz crucible and the carbon crucible.

15 Claims, 4 Drawing Sheets

SILICON MELTING CRUCIBLE

BACKGROUND OF TEE INVENTION

1. Field of the Invention

The present invention concerns a silicon melting crucible used for pulling silicon single crystal and, more specifically, it relates to a silicon melting crucible for preventing deformation of an upper portion of a crucible during pulling.

2. Description of Related Art

For manufacturing silicon single crystals, a method of melting a starting silicon material at high purity in an argon atmosphere under a reduced pressure and solidifying the same using a seed crystal while pulling upwardly by a Czochralski method is known.

FIG. 1 is a view illustrating a silicon single crystal manufacturing device for solidifying a starting molten liquid while pulling up a seed crystal by using a Czochralski method. A pulling up atmosphere for silicon single crystal is tightly sealed in a chamber 6, a crucible 1 is disposed at the inside of the chamber, a heating heater 4 comprising, for example, induction heating coils is disposed at the outer side of and surrounding the crucible, and a heat insulating cylinder 5 formed cylindrically by a heat insulating material is disposed further to the outside thereof. A material for forming crystals melted by the heating heater 4, that is, a molten liquid 7 of the silicon starting material is contained in the melting crucible 1. A lower end of a seed crystal 8 attached to the top end of a pulling rod or wire 10 is in contact with the surface of the molten liquid and, when the seed crystal is pulled upwardly, a silicon single crystal 9 solidified from the molten liquid is grown to the lower end The silicon melting crucible 1 is supported and rotated by a rotational shaft 13, while the silicon single crystal 9 is driven by a rotational mechanism (not illustrated) disposed at an upper portion of the pulling rod and they are rotated in the directions opposite to each other. Further, an argon gas is supplied from a gas supply port 11 and discharged from a gas discharging port 12.

The melting crucible 1 used has a double structure in which the inner wall comprises a container 2 made of quartz (hereinafter referred to as "quartz crucible") while the outer wall comprises a container 3 made of carbon (hereinafter referred to as "carbon crucible"). When the silicon single crystal is manufactured, the diameter of the quartz crucible 2 is enlarged as the pulling diameter is increased, the amount of heat calories used for heating is also increased and the surface temperature of the crucible is also made higher.

Usually, the upper end of the melting crucible is constituted such that the side wall of the quartz crucible is higher than the side wall of the carbon crucible. Therefore, when the crucible is exposed to a high temperature during pulling of the silicon single crystal, the quartz crucible is deformed by turning-down at the upper portion to the inner side, or buckling may be caused by the weight of the quartz crucible. Upon such an incident, pulling up of silicon single crystal has to be interrupted. Further, during manufacture of the silicon single crystal, since a SiO gas is released always from the surface of the molten liquid, the SiO gas invades between the quartz crucible and the carbon crucible, by which carbon (C) is involved in a siliciding reaction (SiO+ C→SiC) to lower the working life of the carbon crucible.

FIG. 2 and FIG. 3 are views illustrating the state for the deformation of the quartz crucible and occurrence of the siliciding reaction to the carbon crucible during pulling up of the silicon single crystal. FIG. 2 is a vertical cross sectional view of a melting crucible illustrating a state in which the upper portion of a quartz crucible of the silicon melting crucible is turned-down to the inside (on the left of the figure) and a state in which siliciding reaction occurs to the carbon crucible (on the right of the figure). Further, FIG. 3 is a vertical cross sectional view of the melting crucible illustrating a state of buckling (on the left of the figure) and a state of bending (on the right of the figure) caused by the weight of the quartz crucible of the silicon melting crucible.

FIG. 2 shows a turned-down portion 18 in which the upper portion of the quartz crucible is deformed so as to turn-down to the inside of the crucible on the left, while showing a portion 19 causing a siliciding reaction to the carbon crucible on the right. As shown on the left of the figure, if the turned-down portion 18 is formed on the quartz crucible, the SiO gas is liable to be deposited on that portion. As the deposition continues, the SiO gas is oxidized into granular $SiO_2$ and falls into the molten silicon liquid.

While the single crystal during pulling is pulled up in a dislocation free state, fallen $SiO_2$ moves to the growing boundary of the silicon single crystal and then invades into the single crystal thereby giving rise to dislocation and requiring interruption of pulling. Further, if the portion 19 causing the siliciding reaction is present in the carbon crucible as shown on the right of the figure, a gap is formed between the carbon crucible and the quartz crucible and the SiO gas further intrudes to silicide the carbon crucible more and results in severe injury making it impossible for reuse.

FIG. 3 shows a buckled portion 20 caused by the weight of the quartz crucible on the left, while a bent portion 21 caused by softening of the quartz crucible under a high temperature on the right of the figure. Also in case of deformation of the quartz crucible, pulling of dislocation free crystal is difficult by the deposition of SiO and falling of granular $SiO_2$ like that in the turned-down deformation shown in FIG. 2.

For overcoming such problems, Japanese Laid-open Patent Application No. 63-315263 proposes a melting crucible in which a flange diverging outwardly is provided integrally to the upper end of a cylindrical side wall of a quartz crucible. However, fabrication of the integrally disposing outwardly diverging flange is troublesome making the cost higher. Further, Japanese Laid-open Patent Application No. 3-290393 has proposed a melting crucible in which a quartz ring is disposed on and covers the upper end of a cylindrical side wall of a melting crucible. However, when exposed to a high temperature, the quartz ring is fused to the quartz crucible and is no more detachable therefrom to result in a problem that the quartz ring can not be utilized again.

Further, since it is important to enable high speed pulling and thereby improving the productivity in the manufacture of the silicon single crystal, Japanese Laid-open Patent Application No. 6-32692 proposes a silicon melting crucible in which the upper end of a side wall of a quartz crucible is tapered so as to diverge upwardly in order to increase the amount of polycrystal silicon to be filled as the starting crystal material and it is described that a tapered angle of 45° at the upper end of the side wall is particularly suitable. However, the proposed quartz crucible intends to increase only the filling amount of the starting crystal material and takes no consideration for preventing deformation such as turning-down and buckling of the quartz crucible or generation of siliciding reaction to the carbon crucible at all. For instance, if the silicon single crystal pulling is practiced under the condition at the tapered angle of 45° adopted there, the upper portion of the quartz crucible deforms remarkably toward the inside of the crucible to form a bent portion 21 as shown on the right of FIG. 3. As a result, flow of an argon gas in the single crystal pulling region is disturbed, to bring about a problem that the SiO gas generated from the surface of the molten liquid can not be discharged efficiently, but granular $SiO_2$ deposited on the deformed portion falls into the molten liquid to give rise to dislocation for the single crystal to be manufactured.

SUMMARY OF THE INVENTION

An object of the present invention is to provide a silicon melting crucible free from deformation such as turning-down at the upper portion or buckling of a quartz crucible in a high temperature atmosphere upon silicon single crystal pulling and capable of extending the working life of a carbon crucible.

The present invention has been achieved for attaining the foregoing object and the gist of the present invention resides in a silicon melting crucible having the following features (1) to (4):
(1) A silicon melting crucible of a double structure in which a quartz crucible is inserted to the inside of a carbon crucible, wherein an upper portion of the quartz crucible has a frust-conical inclined portion 14 (refer to FIG. 4).
  In this case, the angle α for the frust-conical inclined portion is desirably from 5 to 40°.
(2) A silicon melting crucible of a double structure in which a quartz crucible is inserted to the inside of a carbon crucible, wherein a carbon ring of an L-cross sectional shape engaged and held on the upper portion of the quartz crucible and the carbon crucible (refer to FIG. 5).
(3) A silicon melting crucible of a double structure in which a quartz crucible is inserted to the inside of a carbon crucible, wherein a carbon ring 16 of downwardly opened U-cross sectional shape is inserted to the upper portion of the quartz crucible and the carbon crucible while being capped over both of them (refer to FIG. 6).
(4) A silicon melting crucible of a double structure in which a quartz crucible is inserted to the inside of a carbon crucible, wherein carbon clips 17 each of downwardly opened U-cross sectional shape are inserted intermittently to the upper portion of the quartz crucible and the carbon crucible while riding over both of them (refer to FIG. 7).

DESCRIPTION OF THE PREFERRED EMBODIMENT

Figure 4:
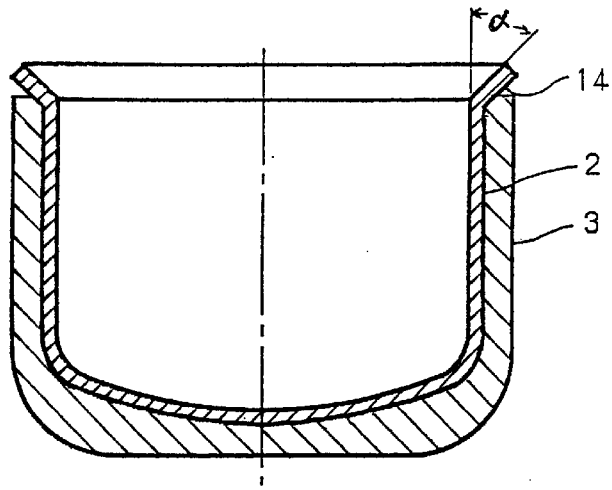
FIG. 4 is a view illustrating a vertical cross sectional view for a silicon melting crucible according to the present invention.

FIG. 4 is a view illustrating a vertical cross sectional view of a silicon melting crucible according to the present invention. As shown in the figure, a melting crucible 1 according to the present invention has a double structure in which an inner quartz crucible 2 is inserted in an outer carbon crucible 3. Then, an upper portion of the quartz crucible 2 is formed as an outwardly diverging inclined portion 14 and disposed integrally with the side wall, thereby increasing the rigidity of the quartz crucible and preventing turning-down to the inside of the crucible. In addition, buckling or bending caused by the own weight of the quartz crucible can be suppressed. In this case, since the angle α at the inclined portion gives an effect on the occurrence of a buckled portion and a bent portion of the quartz crucible, it may be selected within a predetermined range and is desirably from 5 to 40°.

Figure 3:
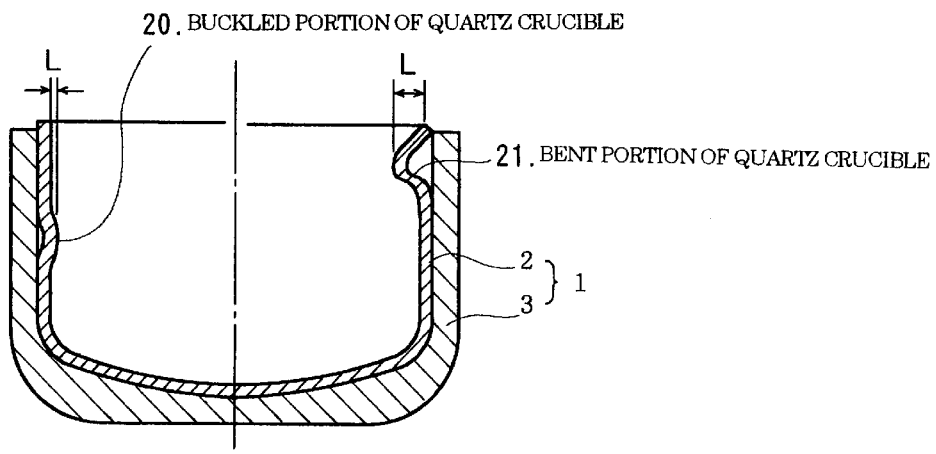
FIG. 3 is a vertical cross sectional view of a melting crucible illustrating a deformed state of an existent silicon melting crucible, that is, a state of buckling (on the left of the figure) and the state of bending (on the right of the figure) caused by the own weight of the quartz crucible of the silicon melting crucible.

If the angle α at the frust-conical inclined portion of the quartz crucible is not more than 5°, it is difficult to increase the rigidity of the quartz crucible to prevent turning-down of the crucible. Further, a buckled portion 20 is liable to be formed by the own weight at the central portion of the quartz crucible as shown on the left of FIG. 3. On the other hand, if the angle α for the inclined portion exceeds 40°, as in the quartz crucible proposed by Japanese Laid-open Patent Application No. 6-32692 described above, bending fabrication for the quartz crucible is difficult and results in an increased cost. In addition, although the deformation of the quartz crucible caused by the own weight can be moderated, the upper portion of the quartz crucible softened under the high temperature condition during pulling may sometimes be deformed toward the inside of the crucible along with the increase of the angle α at the inclined portion, to form a bent portion 21. Accordingly, by making the angle α for the inclined portion as from 5 to 40° as shown in "Example 1" to be described later, it is possible to minimize the deformation of the quartz crucible shown by a deformation amount L in FIG. 3 to overcome the problem of giving rise to dislocation caused by the deformation of the crucible.

Figure 5:
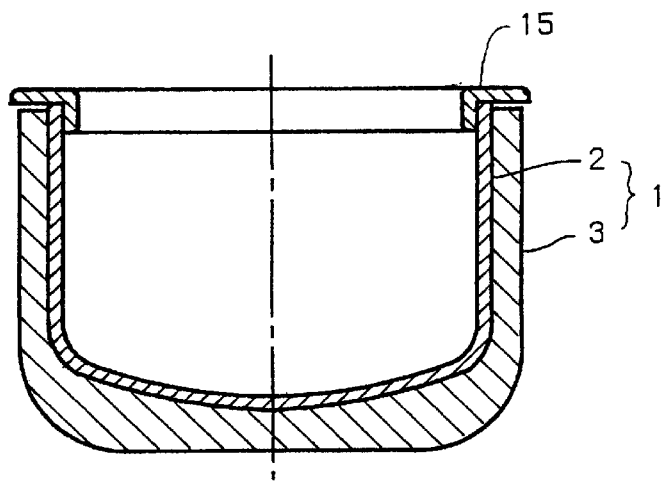
FIG. 5 to FIG. 7 are views illustrating vertical cross sectional views of other embodiments of the silicon melting crucible according to the present invention.

FIG. 5 is a view illustrating a vertical cross section of a silicon melting crucible in another embodiment of the present invention. In the melting crucible 1 of the present invention, as shown in the figure, both a quartz crucible 2 and a carbon crucible 3 stand upright in parallel at the upper portion of the side wall of the melting crucible, and a carbon ring 15 of such an L-cross sectional shape as is capable of engagement at the upper end thereof is inserted to the inside of the quartz crucible. The outer diameter of the carbon ring (diameter for the outer circumference) is desirably greater than the outer diameter of the carbon crucible. By the insertion of the carbon ring, the rigidity of the quartz crucible is increased and turning-down to the inside of the crucible can be prevented. Further, since carbon has better workability compared with quartz, the carbon ring may have an inclination as shown in FIG. 4.

Figure 6:
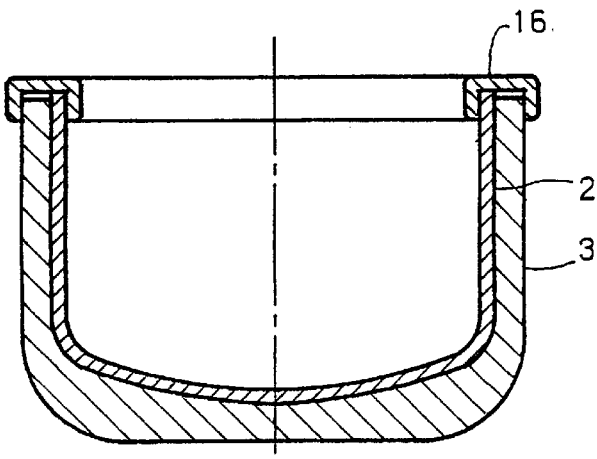

FIG. 6 is a view illustrating a vertical cross sectional view of a silicon melting crucible of a further embodiment according to the present invention. The melting crucible 1 of the present invention is constituted, as shown in the figure, by inserting a carbon ring 16 of downwardly opened U-cross sectional shape to the upper portion of the side wall of the melting crucible by capping and sandwiching the upper portion of the side wall of the quartz crucible 2 and the carbon crucible 3 therebetween. By the insertion of the U-shaped carbon ring, the rigidity of the quartz crucible can be increased, turning-down to the inside of the crucible can be prevented, and the siliciding reaction of the carbon crucible can be prevented.

Figure 7:
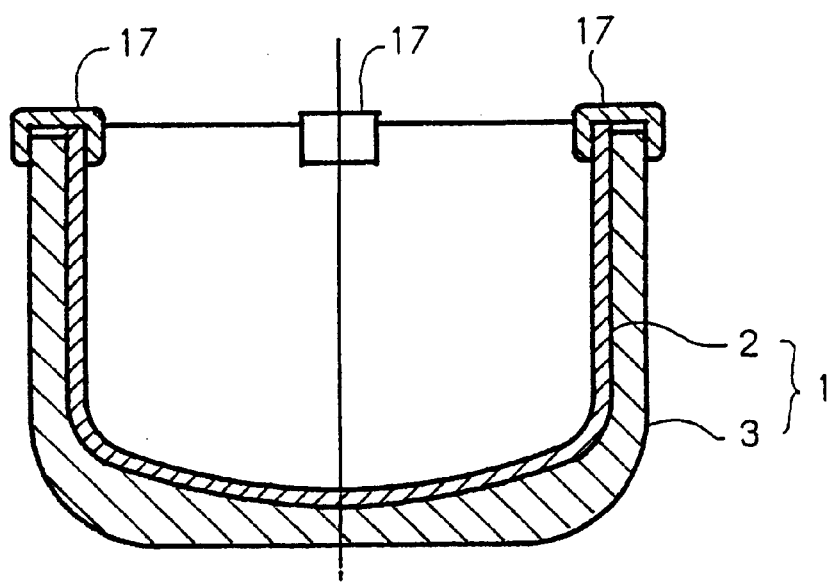

FIG. 7 is a view illustrating a vertical cross sectional view of a silicon melting crucible of a further embodiment according to the present invention. In the melting crucible 1 of the invention, as shown in the figure, carbon clips 17 each of a downwardly opened U-cross sectional shape are disposed to the upper portion for the side wall of the melting crucible by intermittently sandwiching the upper portion of the side walls of the quartz crucible 1 and the carbon crucible 3 therebetween. By the intermittent insertion of the carbon dips, rigidity of the quartz crucible can be increased and turning-down to the inside of the crucible can be overcome.

The length of the carbon clip varies depending on the size of the crucible used. In a case of a crucible having 22 inch diameter, it is desirable that the clips have a length of about 50 mm and disposed circumferentially by the number of about 4 to 8.

The effect of the silicon melting crucible according to the present invention will be explained with reference to concrete embodiments.

(EXAMPLE 1)

Figure 1:
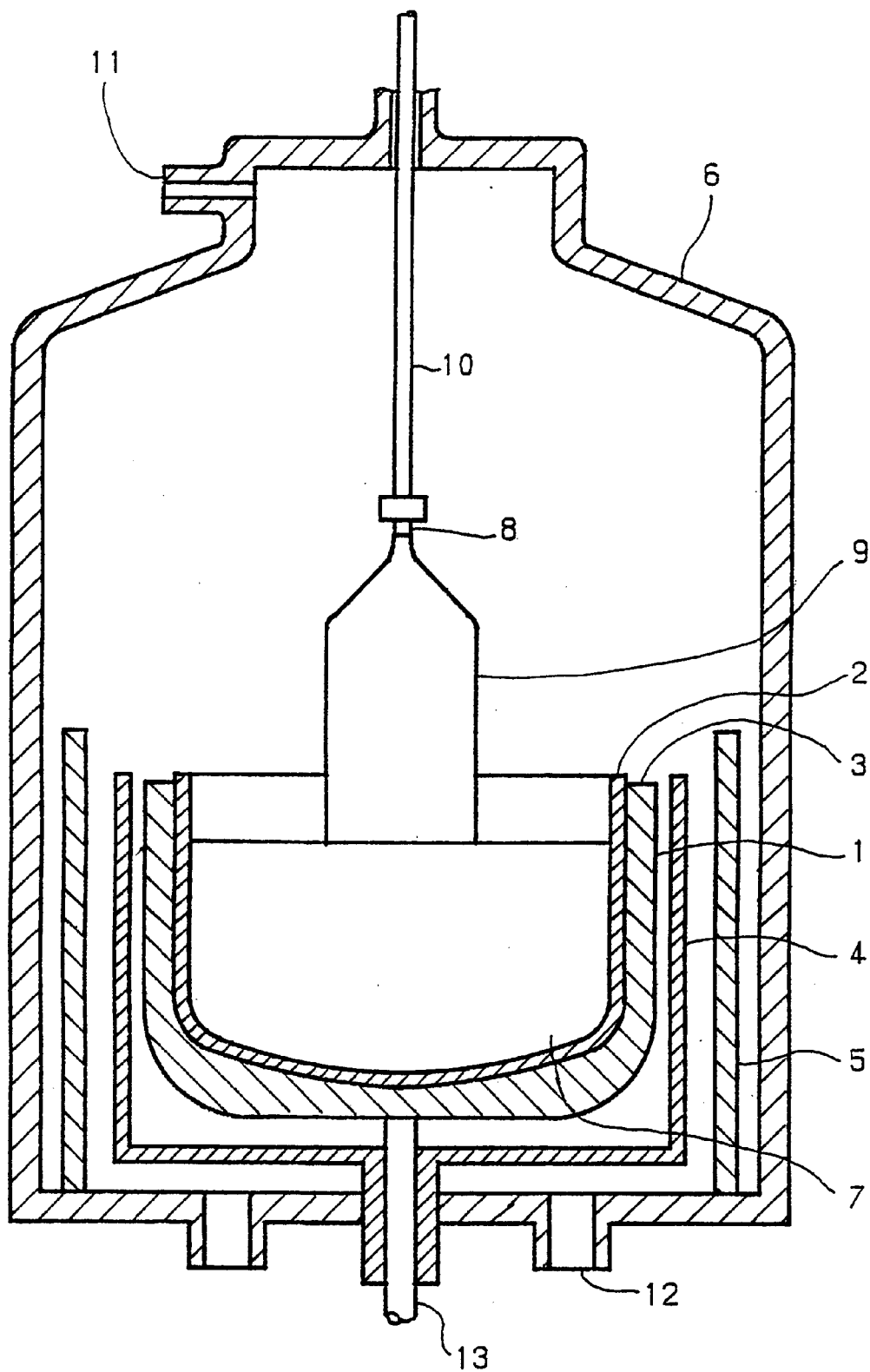
FIG. 1 is a vertical cross sectional view illustrating a device for manufacturing silicon single crystal by solidification during pulling.
Figure 2:
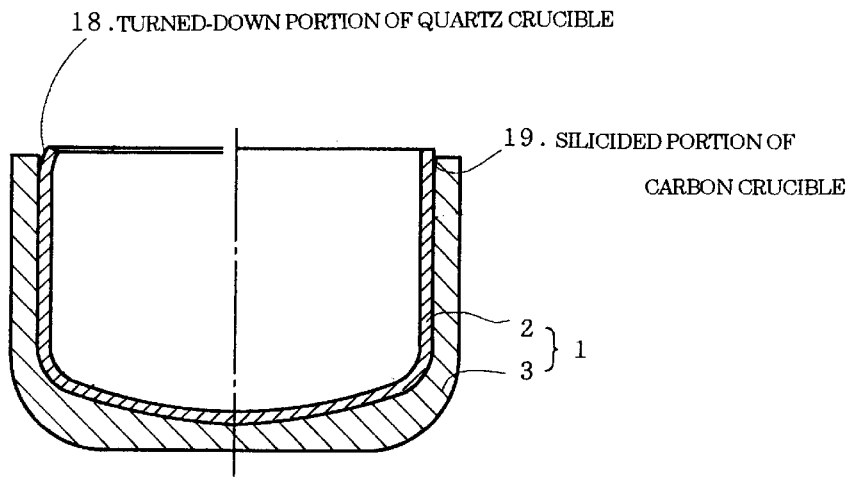
FIG. 2 is a vertical cross sectional view of a melting crucible illustrating a deformed state of an existent silicon melting crucible, that is a state in which an upper portion of a quartz crucible of the silicon melting crucible is turned-down to the inner side (on the left of the figure) and a state in which siliciding reaction occurs to a carbon crucible (on the right of the figure).

A silicon single crystal manufacturing device shown in FIG. 1 was constituted by disposing the melting crucible of the present invention shown in FIG. 4, and a single crystal of 8 inch diameter was manufactured. A quartz crucible having a 560 mm (22 inch) inner diameter and a 360 mm height was used, and 100 kg of polycrystal silicon was melted to manufacture a single crystal of 1,000 mm length. Ten single crystals were manufactured, respectively, while varying the angle α for the frust-conical inclined portion within a range from 2 to 60° under each of the conditions, and the deformation amount L (refer to FIG. 3) of the quartz crucible and the dislocation free rate (%) were measured. The results of measurement are shown in Table 1. The dislocation free ratio (%) shows the ratio for the amount of the dislocation free single crystal relative to the pulling amount of the single crystal at a straight body portion.

TABLE 1

| Angle α (°) | Crucible deformation amount L (cm) | Dislocation free ratio (%) |
| --- | --- | --- |
| 2 | 10 | 52 |
| 5 | 2 | 81 |
| 10 | 0 | 90 |
| 20 | 0 | 92 |
| 30 | 0 | 91 |
| 40 | 3 | 85 |
| 45 | 8 | 58 |
| 50 | 10 | 37 |
| 60 | 12 | 41 |

As apparent from the results in Table 1, the angle α for the inclined portion is desirably selected within a range from 5 to 40°. This can reduce the deformation of the quartz crucible and prevent dislocation in the single crystal to be pulled up.

(EXAMPLE 2)

The silicon single crystal manufacturing device shown in FIG. 1 was constituted by disposing the melting crucible of the present invention shown in FIG. 5, and the single crystal of 8 inch diameter was manufactured. A quartz crucible having a 560 mm (22 inch) inner diameter and a 360 mm height was used, and 100 kg of polycrystal silicon was melted to manufacture a single crystal of 1,000 mm length, like that in Example 1. Further, an existent melting crucible as shown in FIG. 1 was used as a comparative example to manufacture the same silicon single crystal in the same manner.

When a melting crucible in which a carbon ring of an L-cross sectional shape was used in the upper portion of the quartz crucible and the carbon crucible shown in FIG. 5 was used, neither deformation nor buckling of the quartz crucibles was observed during pulling of 25 times. On the contrary, in the comparative example using the existent melting crucible, deformation and buckling of the quartz crucibles were observed for 18 times in 25 times of pulling and pulling operation had to be interrupted as much as by three times among the 18 times. Accordingly it can be seen that turning-down of the side wall of the quartz crucible to the inside can be prevented by inserting the carbon ring of the L-cross sectional shape.

(EXAMPLE 3)

The silicon single crystal manufacturing device shown in FIG. 1 was constituted by disposing the melting crucible of the present invention shown in FIG. 6 or FIG. 7 and single crystal of 8 inches diameter was manufactured. A quartz crucible having a 560 mm (22 inch) inner diameter and a 360 mm height was used, and 100 kg of polycrystal silicon was melted to manufacture a single crystal of 1,000 mm length.

When a melting crucible as shown in FIG. 6 in which a carbon ring of a downwardly opened U-cross sectional shape was inserted to the upper portion of the quartz crucible and the carbon crucible was used, neither deformation nor buckling was observed for the quartz crucible in 25 times of pulling. Further, when a melting crucible as shown in FIG. 7 in which carbon clips each of 60 mm length and having a downwardly opened U-cross sectional shape were inserted by the number of six on the circumference to the upper portion of the quartz crucible and carbon crucible was used, neither deformation nor buckling of the quartz crucibles was observed for 25 times of pulling.

By the insertion of the carbon ring having a downwardly opened U-cross sectional shape to the upper portion of the quartz crucible and the carbon crucible, turning-down of the side wall of the quartz crucible to the inside is prevented, intrusion of an SiO gas to a portion between the quartz crucible and the carbon crucible was eliminated and silicidation of carbon crucible (formation of C into SiC) could be prevented to extend the working life of the carbon crucible.

As has been described above, by the device for manufacturing a silicon single crystal using the silicon melting crucible according to the present invention, it is possible to prevent turning-down, and deformation such as buckling or bending of the side wall of the quartz crucible and intrusion of the SiO gas to a portion between the quartz crucible and the carbon crucible and, accordingly, the number of silicon single crystals to be manufactured per one melting crucible can be increased.

What is claimed is:

1. A silicon melting crucible having a double structure in which a quartz crucible is inserted on the inside of a carbon crucible, wherein a frusto-conical inclined portion is disposed at an upper portion of the quartz crucible, and, wherein an angle α for the frusto-conical inclined portion is from 5 to 40°.

2. A silicon melting crucible as defined in claim 1, wherein the inner diameter of the quartz crucible inserted to the inside of the carbon crucible is 22 inches or more.

3. A silicon melting crucible as defied in claim 1, wherein the diameter of a silicon single crystal to be pulled up has a large diameter of 8 inches or more.

4. A silicon melting crucible having a double structure in which a quartz crucible is inserted to the inside of a carbon crucible, wherein a carbon ring having an L-cross sectional shape which is engaged and held on an upper portion of the quartz crucible and the carbon crucible is inserted in the quartz crucible.

5. A silicon melting crucible as defined in claim 4, wherein the outer diameter for a flange portion of the carbon ring of the L-cross sectional shape is greater than the outer diameter of the carbon crucible.

6. A silicon melting crucible as defined in claim 4, wherein the flange portion of the carbon ring of the L-cross sectional shape has an inclined portion.

7. A silicon melting crucible as defined in claim 4, wherein the inner diameter of the quartz crucible inserted to the inside of the carbon crucible is 22 inch or more.

8. A silicon melting crucible as defined in claim 4, wherein the diameter of the silicon single crystal to be pulled up has a large diameter of 8 inch or more.

9. A silicon melting crucible having a double structure in which a quartz crucible is inserted to the inside of a carbon crucible, wherein a carbon ring of a downwardly opened U-cross sectional shape is inserted to an upper portion of the quartz crucible and the carbon crucible while capping both of them.

10. A silicon melting crucible as defined in claim 9, wherein the inner diameter of the quartz crucible inserted to the inside of the carbon crucible is 22 inch or more.

11. A silicon melting crucible as defined in claim 9, wherein the diameter of the silicon single crystal to be pulled up has a large diameter of 8 inch or more.

12. A silicon melting crucible having a double structure in which a quartz crucible is inserted to the inside of a carbon crucible, wherein carbon clips each of a downwardly opened U-cross sectional shape are inserted intermittently to an upper portion of the quartz crucible and the carbon crucible while riding over both of them.

13. A silicon melting crucible as defined in claim 12, wherein about four to eight carbon clips each having a downwardly opened U-cross sectional shape are inserted on circumferential spacing.

14. A silicon melting crucible as defined in claim 12, wherein the inner diameter of the quartz crucible inserted to the inside of the carbon crucible is 22 inch or more.

15. A silicon melting crucible as defined in claim 12, wherein the diameter of the silicon single crystal to be pulled up has a large diameter of 8 inch or more.

* * * * *